United States Patent [19]

Laupman

[11] 4,322,690

[45] Mar. 30, 1982

[54] DEVICE FOR PROTECTING AN AUDIO AMPLIFIER AGAINST OVERLOAD OR SHORT-CIRCUIT

[75] Inventor: Robert R. Laupman, Wychen, Netherlands

[73] Assignee: Novanex Automation N.V., Wychen, Netherlands

[21] Appl. No.: 97,159

[22] Filed: Nov. 26, 1979

[30] Foreign Application Priority Data

Nov. 24, 1978 [NL] Netherlands ................. 7811584

[51] Int. Cl.³ .......................................... H03F 3/04
[52] U.S. Cl. ............................................... 330/298
[58] Field of Search ........................ 330/207 P, 298

[56] References Cited

U.S. PATENT DOCUMENTS 4,057,767 11/1977 Laupman .................... 330/207 P

*Primary Examiner*—James B. Mullins
*Attorney, Agent, or Firm*—Diller, Ramik & Wight

[57] ABSTRACT

A short-circuit protection device for an audio amplifier, comprising a preamplifier and an output amplifier including one or more current amplifier branches each having an output transistor included therein. A measuring resistor is connected between an electrode of each output transistor and the output of the amplifier. A feedback transistor is connected in parallel with at least one of the measuring resistors and is connected to the control electrode of a thyristor. The thyristor has an electrode connected to one or more current source transistors so as to block these transistors and to decouple the output amplifier upon the occurrence of an excessive current in one of the current amplifier branches of the output amplifier.

8 Claims, 1 Drawing Figure

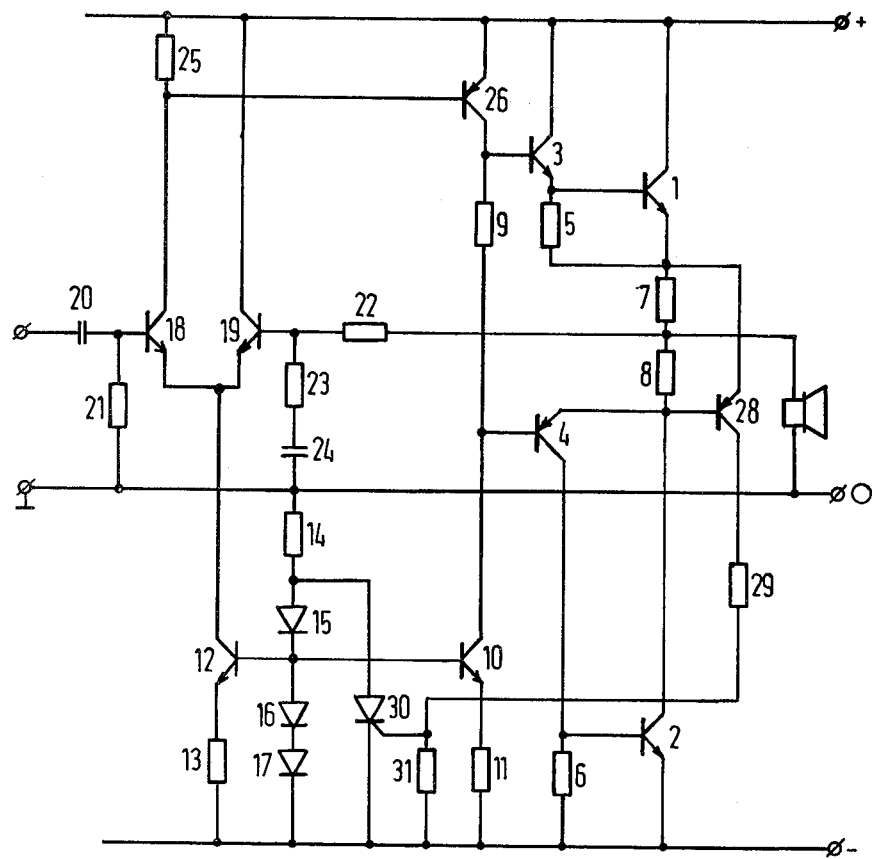

DEVICE FOR PROTECTING AN AUDIO AMPLIFIER AGAINST OVERLOAD OR SHORT-CIRCUIT

The invention relates to a device for protecting an audio amplifier against overload or short-circuit, which device comprises a preamplifier and an output amplifier including one or more current amplifier branches each having an output transistor included therein, a measuring resistor being connected between an electrode of each output transistor and the output of the amplifier, and a feedback transistor having the path between its base and one of its electrodes connected in parallel with at least one of the measuring resistors and having its other electrode connected to the control electrode of a thyristor.

As known from Dutch patent application No. 74,00977, it is possible to decouple the output amplifier upon the occurrence of overload or short-circuit by connecting the path between one electrode and the base of a feedback transistor to the ends of the series-connection of two measuring resistors connected to the output transistors and by connecting the other electrode of this feedback transistor to the control electrode of a thyristor.

A drawback inherent in this arrangement is that it should include two current limiting transistors which realize the first phase of the protection by limiting the current through the output transistors to a safe value. The second phase of the protection is realized as the feedback transistor is rendered conducting by the voltage occurring in response to the unduly high current through the measuring resistors, which transistor then triggers the thyristor, whereby the output amplifier is decoupled. A further drawback of the prior arrangement is that the thyristor bridges substantially both supply voltages of the audio amplifier and is sometimes erroneously triggered in response to undue dv/dt effects or current pulses on the supply lines; moreover, this thyristor has to switch a relatively high current, which necessitates the use of a thyristor of a type capable of switching high voltages and currents.

It is an object of the invention to provide a device that is of considerably simpler structure than the prior device but still adequately and completely protects the audio amplifier against overload and short-circuit without reducing its output power.

At the same time, it is an object of the invention to provide a protection device that is less responsive to disturbances occurring in the supply lines than the prior device and employs a thyristor that need only be capable of switching low voltages and a low current, such thyristor being considerably less expensive than the thyristor required in the prior device.

The device according to the invention is characterized in that an electrode of the thyristor is connected to one or more current source transistors adapted to supply the respective control current for the one or more current amplifier branches, so as to block these one or more current source transistors and to decouple the output amplifier in response to the occurrence of an excessive current in one of the current amplifier branches of the output amplifier.

The invention will be described in greater detail hereinafter with reference to the drawing showing an embodiment of the device according to the invention.

The amplifier shown in the drawing comprises an output amplifier including output transistors 1 and 2 with associated emitter-base resistors 5 and 6, which output transistors can be controlled by control transistors 3 and 4. The output transistors apply their currents through measuring resistors 7 and 8 to a common output terminal to which a speaker is connected that constitutes the connection with zero conductor 0.

The bases of control transistors 3 and 4 are connected to a resistor 9 across which a bias voltage for the output transistors is maintained by a current source formed by, inter alia, the transistor 10 and constituting one branch of a dual current source formed by transistors 10 and 12, resistors 11, 13 and 14, and diodes 15, 16 and 17.

The second branch of this dual current source, i.e. the branch including current source transistor 12, supplies the current for the differential input amplifier composed of transistors 18 and 19. This differential input amplifier compares the input signal applied through a capacitor 20 to a resistor 21 with the output signal divided by the resistors 22 and 23, this divider being connected to ground through a capacitor 24.

The collector circuit of transistor 18 includes a resistor 25, and the base of a transistor 26 is connected to the junction point of transistor 18 and this resistor 25. Jointly with current source transistor 10, transistor 26 realizes the control of the output amplifier.

A feedback transistor 28 has its emitter connected to one end of the series-connection of measuring resistors 7 and 8, and has its base connected to the other end of this series-connection. The collector of feedback transistor 28 is connected through a current limiting resistor 29 to the control electrode of a thyristor 30, a resistor 31 connected between this control electrode and the negative supply voltage ensuring a proper blocking of the thyristor. The thyristor is connected between the anode of diode 15 and the negative supply voltage. Connected in this manner, the thyristor switches only a very low voltage, i.e. thrice a diode voltage, and also a very low current. Moreover, in this manner the thyristor is virtually non-responsive to disturbances occurring in the supply lines as the voltage levels of the thyristor are located practically entirely on the minus-side.

Resistors 7 and 8 have values to ensure that, when a current in excess of an allowable value flows through the output transistors 1 and 2, such a voltage is produced across resistors 7 or 8 that the feedback transistor 28 becomes conducting to trigger through current limiting resistor 29 the thyristor 30. With this thyristor triggered, a connection is established between the junction point of diode 15 and thyristor 30 and the negative potential, and current source transistors 10 and 12 become non-conducting.

As current source transistor 12 supplies the current for the differential amplifier and thus the control current for transistor 26, this transistor 26 becomes non-conducting too. Consequently, the supply of control current to control transistors 3 and 4 is discontinued at the same moment. The two output transistors 1 and 2 are now "floating" and can move "freely" between virtually the positive and the negative potential and can therefore also be short-circuited to ground potential.

Cancellation of the currents of the dual current source results in concurrent cancellation of the currents of output transistors 1 and 2, with the important advantage that the output impedance of the amplifier increases from the initial, very low value to a very high value in a very brief peiod of time. It has appeared that a factor 1000 is readily obtainable. In view thereof, amplifiers protected by the device according to the invention are eminently suited for parallel arrangement.

The two current supply paths respond so fast to the switch-off command that no additional protection arrangements are required for protecting the output stages. This is partly due to the rapid increase in impedance at the output, so that switch-off phenomena of, for example, inductive loads can no longer result in high currents even during the switching off.

I claim:

1. In an audio amplifier circuit, the combination of:
a supply voltage terminal;
an output transistor and a measuring resistor, the current-conducting electrodes of said transistor being connected in series with said resistor to define an output terminal of the amplifier;
control means connected to the control electrode of said transistor for biasing said transistor to conduct current in accord with an audio signal, said control means comprising a current source transistor, a current limiting resistor connected to said supply voltage terminal in series with the current-conducting electrodes of said current source transistor, low voltage bias means connecting said supply voltage terminal to the control electrode of said current source transistor, and current varying means connected in series with said current-conducting electrodes of said current source transistor;
a thyristor having anode, cathode and control electrodes, the anode and cathode electrodes being connected essentially in parallel with said low voltage bias means whereby the thyristor is essentially immune to spurious pulses on said supply voltage terminal; and
means responsive to excess current flowing through said measuring resistor and connected to the control electrode of said thyristor for decoupling the output transistor.

2. In an audio amplifier as defined in claim 1 wherein said low voltage bias means comprises diode means providing the low voltage bias for the current source transistor.

3. In an audio amplifier as defined in claim 2 wherein said diode means comprises a pair of diodes in series, and including a third diode in series with said pair of diodes, the anode and cathode electrodes of said thyristor being connected across the three diodes.

4. In an audio amplifier, the combination of:
a pair of supply voltage terminals and an earth terminal;
a pair of output transistors having their current-conducting paths connected in series between said supply voltage terminals and including a pair of measuring resistors connected in series between said output transistors, the junction between said resistors providing one output terminal of the amplifier and said earth terminal providing the other output terminal of the amplifier;
control bias means for alternately causing said output transistors to conduct in accord with an audio signal, said control bias means comprising current source means and current varying means connected in series across said voltage supply terminals, said current source means comprising a current source transistor and a current limiting resistor, said current limiting resistor being connected to one voltage supply terminal and the current-conducting electrodes of said current source transistor being in series therewith, and current source biasing means connected across said one supply voltage terminal and said earth terminal for maintaining a low voltage bias at the control electrode terminal of said current source transistor;
a thyristor having one of its anode and cathode electrodes connected to said one voltage supply terminal and the other electrode to said current source biasing means whereby the anode to cathode potential of the thyristor is substantially the same as said low voltage bias; and
means connected to the control electrode of said thyristor and responsive to excess current flowing through either one of said measuring resistors for triggering said thyristor to decouple the amplifier.

5. In an audio amplifier as defined in claim 4 wherein said low voltage bias means comprises diode means providing the low voltage bias for the current source transistor.

6. In an audio amplifier as defined in claim 4 wherein said diode means comprises a pair of diodes in series, and including a third diode in series with said pair of diodes, the anode and cathode electrodes of said thyristor being connected across the three diodes.

7. An audio amplifier comprising, in combination:
an earth terminal and a second terminal proving input terminals to which an audio signal is to be applied;
a pair of voltage supply terminals;
a pair of measuring resistors connected in series to define a junction providing a third terminal, said third terminal and said earth terminal providing output terminals for the amplifier, a first output transistor and a second output transistor, the current-conducting electrodes of said transistors being connected in series across said voltage supply terminals with said resistors between them;
differential amplifier means connected to said second terminal and to said third terminal and a first current source transistor having its current-conducting electrodes connected in series with said differential amplifier means across said supply voltage terminals;
current varying means responsive to said differential amplifier means for alternately causing said output transistors to conduct and a second current source transistor having its current-conducting electrodes connected in series with said current varying means across said voltage supply terminals;
voltage dividing means connected between said earth terminal and one of said voltage supply terminals for providing low voltage bias to the control electrodes of said current source transistors;
a thyristor having one of its cathode and anode electrodes connected to said one voltage supply terminal and the other connected to said voltage dividing means; and
means responsive to excess current through either one of said measuring resistors for triggering said thyristor to decouple said amplifier.

8. An amplifier as defined in claim 7 wherein said voltage dividing means comprising a voltage dropping resistor connected to said earth terminal and a plurality of series connected diodes between said voltage dropping resistor and said one voltage supply terminal.

* * * * *